United States Patent
Chen et al.

(10) Patent No.: US 11,557,666 B2
(45) Date of Patent: Jan. 17, 2023

(54) HIGH ELECTRON MOBILITY TRANSISTOR AND FABRICATION METHOD THEREOF

(71) Applicant: UNITED MICROELECTRONICS CORP., Hsin-Chu (TW)

(72) Inventors: Yen-Hsing Chen, Taipei (TW); Yu-Ming Hsu, Changhua County (TW); Tsung-Mu Yang, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 36 days.

(21) Appl. No.: 17/100,935

(22) Filed: Nov. 22, 2020

(65) Prior Publication Data
US 2022/0093778 A1 Mar. 24, 2022

(30) Foreign Application Priority Data
Sep. 24, 2020 (CN) .......................... 202011015488.7

(51) Int. Cl.
*H01L 29/00* (2006.01)
*H01L 29/778* (2006.01)
*H01L 21/768* (2006.01)
*H01L 21/67* (2006.01)
*H01L 29/66* (2006.01)

(52) U.S. Cl.
CPC .... *H01L 29/7783* (2013.01); *H01L 21/67109* (2013.01); *H01L 21/76864* (2013.01); *H01L 29/66462* (2013.01); *H01L 29/7786* (2013.01)

(58) Field of Classification Search
None
See application file for complete search history.

(56) References Cited

U.S. PATENT DOCUMENTS

| | | | |
|---|---|---|---|
| 7,728,356 B2 | 6/2010 | Suh | |
| 2012/0205718 A1* | 8/2012 | Shimizu | H01L 29/7787 257/E21.403 |
| 2013/0075752 A1 | 3/2013 | Kotani | |
| 2013/0237021 A1 | 9/2013 | Derluyn | |
| 2017/0098701 A1* | 4/2017 | Tomita | H01L 29/7787 |

* cited by examiner

*Primary Examiner* — Reema Patel
(74) *Attorney, Agent, or Firm* — Winston Hsu

(57) ABSTRACT

A high-electron mobility transistor includes a substrate; a channel layer on the substrate; a AlGaN layer on the channel layer; and a P—GaN gate on the AlGaN layer. The AlGaN layer comprises a first region and a second region. The first region has a composition that is different from that of the second region.

8 Claims, 6 Drawing Sheets

HIGH ELECTRON MOBILITY TRANSISTOR AND FABRICATION METHOD THEREOF

BACKGROUND OF THE INVENTION

1. Field of the Invention

The present invention relates to the field of semiconductor technology, in particular to a gallium nitride (GaN) high-electron mobility transistor (HEMT) and a fabrication method thereof.

2. Description of the Prior Art

High electron mobility transistors (HEMTs) are widely used in high-frequency, high-power amplifier components due to high breakdown voltage, high saturation electron moving speed and high operation temperature.

In a typical HEMT, for example, a two-dimensional electron gas (2DEG) is generated at a semiconductor heterojunction. The 2DEG represents a very thin conduction layer of highly mobile and highly concentrated charge carriers free to move readily in the two dimensions of that conduction layer, but constrained from movement in a third dimension perpendicular to the conduction layer. GaN HEMTs are attractive for high speed, high voltage circuits because of their high breakdown field, high electron mobility, and high electron velocity.

For P-type GaN enhancement mode (or E-mode) HEMTs, in order to achieve normally-off (threshold voltage Vth>0) elements, the aluminum composition of the aluminum gallium nitride (AlGaN) barrier layer needs to be reduced. However, reducing the aluminum composition of the AlGaN barrier layer will face the problem of increased on-resistance (Ron).

SUMMARY OF THE INVENTION

It is one object of the present invention to provide an improved high electron mobility transistor that can overcome the shortcomings and deficiencies in the prior art.

One aspect of the present invention provides a high electron mobility transistor (HEMT) including a substrate; a channel layer on the substrate; an AlGaN layer on the channel layer; and a P—GaN gate on the AlGaN layer. The AlGaN layer comprises a first region and a second region. The first region has a composition that is different from that of the second region.

According to some embodiments, the first region is located under the P—GaN gate.

According to some embodiments, the first region has a formula represented by $Al_xGa_{1-x}N$, wherein x=0.05~0.25, and the second region has a formula represented by $Al_yGa_{1-y}N$, wherein y=0.15~1.0, and wherein y>x.

According to some embodiments, the channel layer comprises GaN or AlGaN.

According to some embodiments, the HEMT further includes a buffer layer disposed between the channel layer and the substrate.

According to some embodiments, the HEMT further includes a source region and a drain region on the AlGaN layer; and a source electrode and a drain electrode on the AlGaN layer within the source region and the drain region, respectively.

According to some embodiments, the HEMT further includes a passivation layer on the AlGaN layer, wherein the passivation covers the second region.

According to some embodiments, the AlGaN layer has a thickness of about 8~30 nm.

According to some embodiments, the P—GaN gate has a thickness of about 50~100 nm.

Another aspect of the invention provides a method for fabricating a high-electron mobility transistor (HEMT). A substrate is provided. A channel layer is formed on the substrate. An AlGaN layer is formed on the channel layer. A P—GaN gate is formed on the AlGaN layer. The AlGaN layer is subjected to a thermal treatment, thereby forming a first region and a second region in the AlGaN layer. The first region has a composition that is different from that of the second region.

According to some embodiments, the thermal treatment is carried in a rapid thermal processing (RTP) chamber, a rapid thermal annealing (RTA) chamber, a furnace, or a MOCVD chamber.

According to some embodiments, the thermal treatment comprises the following conditions: temperatures between 500~1200 degree Celsius for a time period of about 1 minute to 2 hours in an atmosphere of $H_2$, $N_2$, $NH_3$, or combinations thereof.

According to some embodiments, after subjecting the AlGaN layer to the thermal treatment, the method further comprises: forming a passivation layer on the second region.

According to some embodiments, the first region is located under the P—GaN gate.

According to some embodiments, the first region has a formula represented by $Al_xGa_{1-x}N$, wherein x=0.05~0.25, and the second region has a formula represented by $Al_yGa_{1-y}N$, wherein y=0.15~1.0, and wherein y>x.

According to some embodiments, the channel layer comprises GaN or AlGaN.

According to some embodiments, before forming the channel layer, a buffer layer is formed on the substrate.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
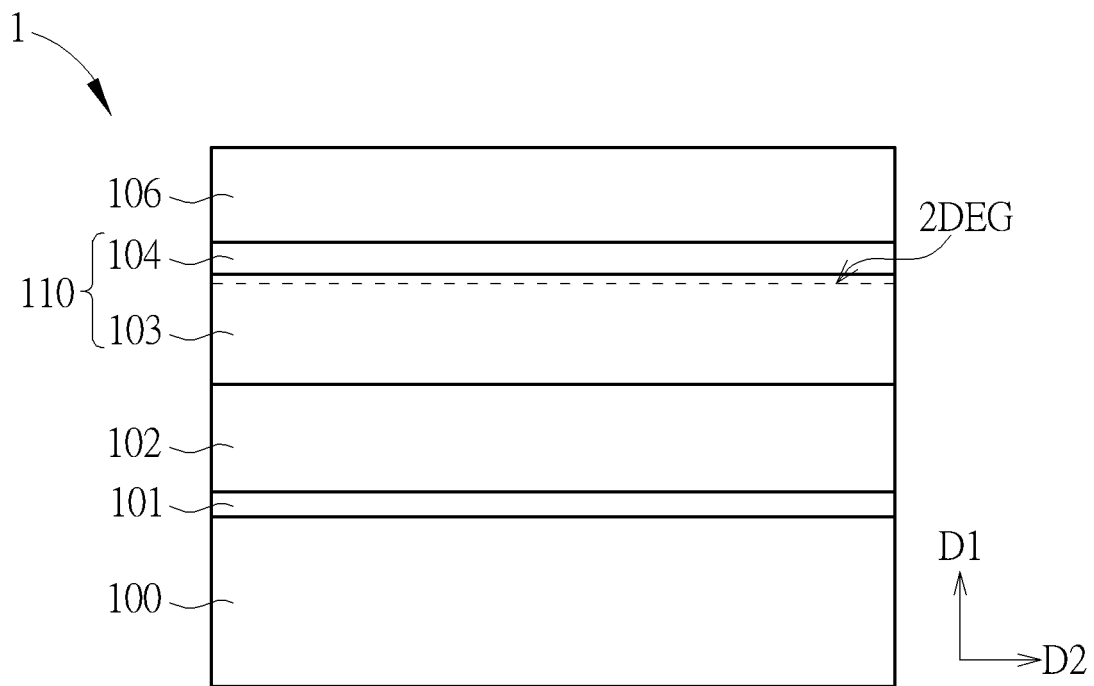
FIG. 1 to FIG. 5 are schematic cross-sectional views illustrating a method for manufacturing a high electron mobility transistor according to an embodiment of the present invention.

Please refer to FIG. 1 to FIG. 5, which are schematic cross-sectional views showing a method for manufacturing a high electron mobility transistor according to an embodiment of the present invention. As shown in FIG. 1, in a first direction D1, the high electron mobility transistor 1 includes, in the order of, a substrate 100, a buffer layer 102 on the substrate 100, and an active layer 110 on the buffer layer 102, and a P-type gallium nitride (P—GaN) layer 106 on the active layer 110. According to an embodiment of the present invention, the active layer 110 may include a channel layer 103, such as a gallium nitride (GaN) layer or an aluminum gallium nitride (AlGaN) layer, between the buffer layer 102 and the P—GaN layer 106. According to an embodiment of the present invention, the active layer 110 may include an AlGaN layer 104 disposed on the channel layer 103 and between the channel layer 103 and the P—GaN layer 106.

According to the embodiment of the present invention, the thickness of the AlGaN layer 104 is approximately 8 to 30 nanometers, but is not limited thereto. According to the embodiment of the present invention, the thickness of the P—GaN layer 106 is about 50 to 100 nanometers, for example, preferably 80 nanometers, but not limited thereto.

According to an embodiment of the present invention, the buffer layer 102, the active layer 110, and the P—GaN layer 106 can be deposited by metal organic chemical vapor deposition (MOCVD) or molecular beam epitaxy (MBE) or other methods, which are sequentially formed on the substrate 100 in the first direction D1.

According to an embodiment of the present invention, for example, the buffer layer 102 may include gallium nitride, but is not limited thereto. According to other embodiments of the present invention, the buffer layer 102 may include AlGaN, AlN, AlN/GaN superlattice, or graded AlGaN, but not limited thereto. According to an embodiment of the present invention, for example, a nucleation layer 101, such as AlN, may be optionally formed between the substrate 100 and the buffer layer 102, but is not limited thereto.

According to an embodiment of the present invention, for example, the buffer layer 102 may have a single-layer or multi-layer structure. For example, the substrate 100 may be a conductive substrate. For example, the substrate 100 may be a silicon substrate, but is not limited thereto. According to an embodiment of the present invention, at the interface between the AlGaN layer 104 and the channel layer 103, a two-dimensional electron gas 2DEG is formed in the second direction D2.

Figure 2:
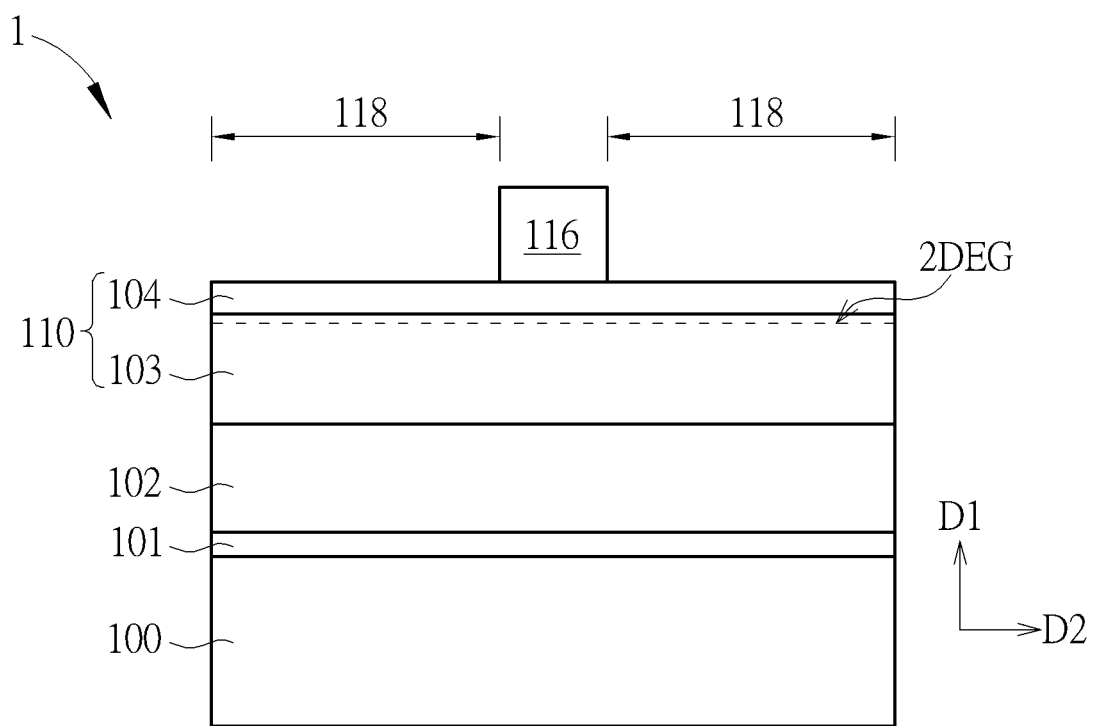

As shown in FIG. 2, a lithography process and an etching process are performed to pattern the P—GaN layer 106 into a P—GaN gate 116, which is disposed on the AlGaN layer 104. According to an embodiment of the present invention, an access region 118 is formed adjacent to the P—GaN gate 116. According to an embodiment of the present invention, the AlGaN layer 104 in the access region 118 is exposed at this point. According to other embodiments, the aforementioned P—GaN gate 116 may be a P-type aluminum indium gallium nitride (AlInGaN) gate.

Figure 3:
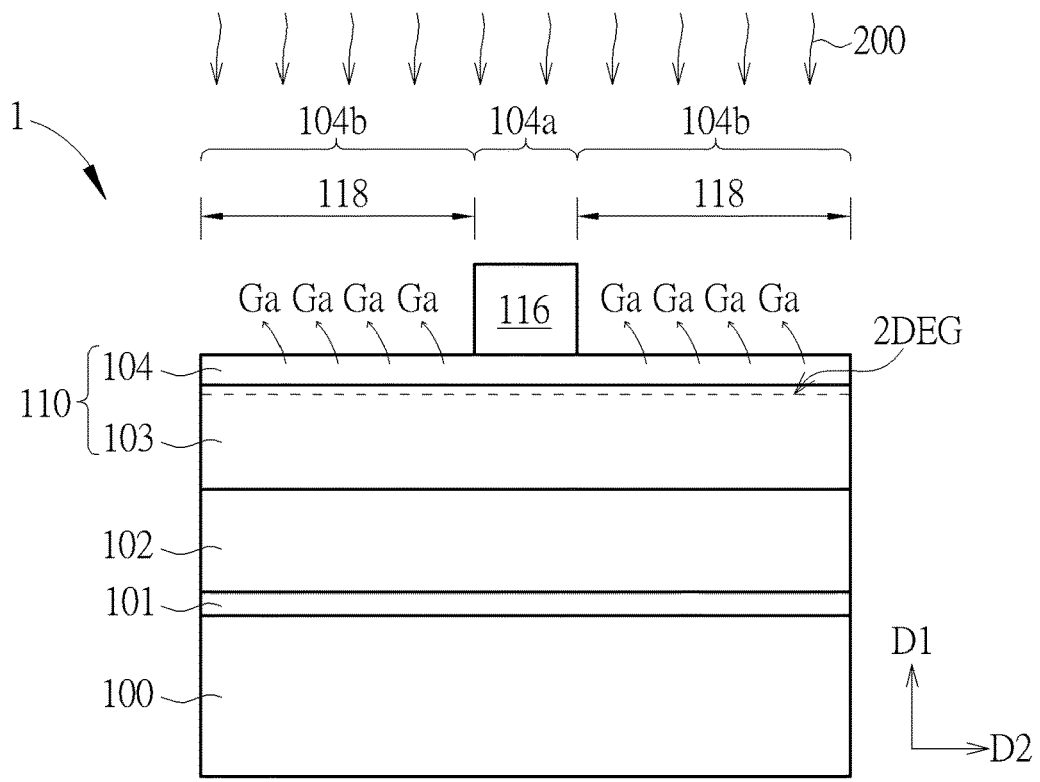

As shown in FIG. 3, the AlGaN layer 104 is then subjected to a thermal treatment 200, thereby forming a first region 104a and a second region 104b in the AlGaN layer 104. The first region 104a does not overlap with the second region 104b According to an embodiment of the present invention, the first region 104a is located under the P—GaN gate 116. According to an embodiment of the present invention, the first region 104a is located directly under the P—GaN gate 116.

According to an embodiment of the present invention, the first region 104a and the second region 104b of the AlGaN layer 104 are composed of AlGaN in different compositions. This is because after the thermal treatment 200 described above, part of the gallium atoms the in the second region 104b escapes from the aluminum gallium layer 104, while the gallium atoms in the first region 104a does not escape from the AlGaN layer 104 because of the blocking of the P—GaN gate 116. Therefore, the gallium composition of the AlGaN layer 104 in the second region 104b is reduced, and the aluminum composition of the AlGaN layer 104 in the second region 104b is relatively increased. The material of the first region 104a is represented by $Al_xGa_{1-x}N$, and the material of the second region 104b is represented by $Al_yGa_{1-y}N$, wherein y>x. The advantage of this is that Ron can be reduced and Vth can be maintained.

According to an embodiment of the present invention, the thermal treatment 200 may be performed in a rapid thermal process (RTP) chamber, a rapid thermal annealing (RTA) chamber, a furnace or a metal organic chemical vapor deposition (MOCVD) chamber. According to an embodiment of the present invention, for example, the thermal treatment 200 includes the following conditions: temperatures between 500~1200 degree Celsius for a time period of about 1 minute to 2 hours in an atmosphere of $H_2$, $N_2$, $NH_3$, or combinations thereof.

According to an embodiment of the present invention, for example, the first region 104a has a molecular formula represented by $Al_xGa_{1-x}N$, where x=0.05~0.25, and the second region 104b has a molecular formula represented by $Al_yGa_{1-y}N$, where y=0.15~1.0. According to an embodiment of the present invention, wherein y>x.

For example, the molecular formula of the first region 104a may be represented by $Al_xGa_{1-x}N$, where x=0.05~0.1, and the molecular formula of the second region 104b may be represented by $Al_yGa_{1-y}N$, where $0.1<y\leq1.0$.

For example, the molecular formula of the first region 104a may be represented by $Al_xGa_{1-x}N$, where x=0.1~0.15, and the molecular formula of the second region 104b may be represented by $Al_yGa_{1-y}N$, where $0.15<y\leq1.0$.

For example, the molecular formula of the first region 104a may be represented by $Al_xGa_{1-x}N$, where x=0.15~0.2, and the molecular formula of the second region 104b may be represented by $Al_yGa_{1-y}N$, where $0.2<y\leq1.0$.

For example, the molecular formula of the first region 104a may be represented by $Al_xGa_{1-x}N$, where x=0.2~0.25, and the molecular formula of the second region 104b may be represented by $Al_yGa_{1-y}N$, where $0.25<y\leq1.0$.

Figure 7:
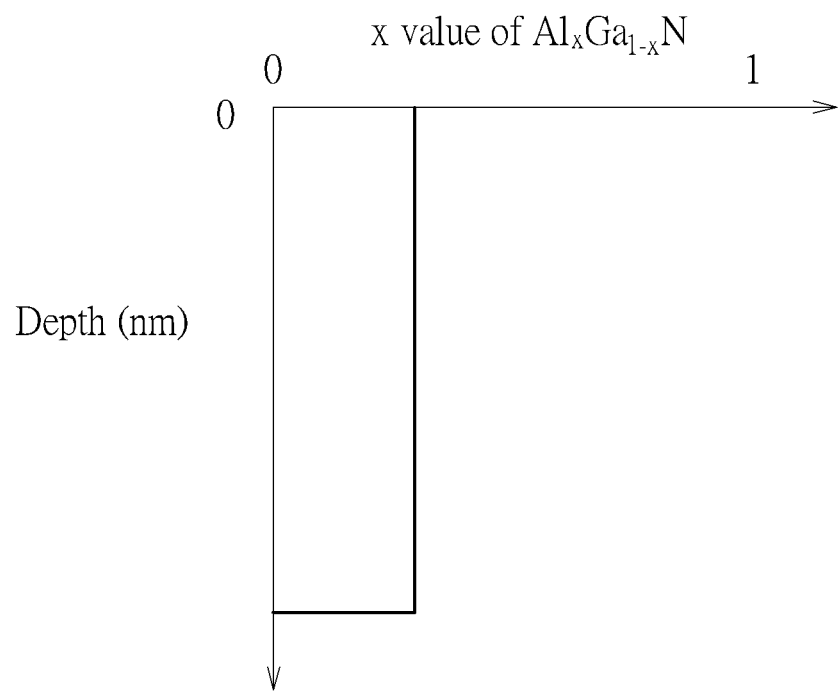
FIG. 7 illustrates a plot showing the x value in the molecular formula represented by $Al_xGa_{1-x}N$ in the first region of the aluminum gallium nitride layer after the thermal treatment is completed, versus the depth of the aluminum gallium nitride layer in the first region.

Please refer to FIG. 6A to FIG. 6D, and briefly to FIG. 7, where FIG. 6A to FIG. 6D are plots illustrating the y value in the molecular formula represented by $Al_yGa_{1-y}N$ in the second region 104b of the AlGaN layer 104 (for example, y=0.25~1.0), versus the depth of the AlGaN layer 104 in the second region 104b, wherein the depth is measured from the upper surface of the AlGaN layer 104 to the entire thickness of the AlGaN layer 104 (approximately 8~30 nm). FIG. 7 is a plot illustrating, after the above thermal treatment 200 is completed, the value of x in the molecular formula represented by $Al_xGa_{1-x}N$ in the first region 104a of the AlGaN layer 104 (for example, x=0.1~0.25) versus the depth of the AlGaN layer 104 in the first region 104a.

As shown in FIG. 6A to FIG. 6D, according to an embodiment of the present invention, after the AlGaN layer 104 is subjected to the thermal treatment 200, the y value of the AlGaN layer 104 in the second region 104b represented by $Al_yGa_{1-y}N$ decreases non-linearly as at least part of the depth increases. In FIG. 6A to FIG. 6D, through different thermal treatment conditions (for example, different heating times), the y value in the molecular formula represented by $Al_yGa_{1-y}N$ in the second region 104b has different gradient changes. For example, in FIG. 6A, after a thermal treatment is performed at, for example, 1000 degrees Celsius for about 3 minutes, the y value of $Al_yGa_{1-y}N$ in the second region 104b of the AlGaN layer 104 rapidly increases at a depth of 2 nm toward the surface in the first direction D1. For example, in FIG. 6B, after the thermal treatment is performed at 900 degrees Celsius for about 30 minutes, the y value of $Al_yGa_{1-y}N$ in the second region 104b of the AlGaN layer 104 gradually increases, slower than the increase rate depicted in FIG. 6A, from the bottom of the AlGaN layer 104 in the first direction D1. For example, in FIG. 6C, after a thermal treatment is performed at 800 degrees Celsius for about 10 minutes, the y value of $Al_yGa_{1-y}N$ of the AlGaN layer 104 in the second region 104b will start to slowly increase at a depth of about 4 nm in the first direction D1. For example, in FIG. 6D, after a thermal treatment is performed at 800 degrees Celsius for about 20 minutes, the y value of $Al_yGa_{1-y}N$ of the AlGaN layer 104 in the second region 104b will start to slowly increases from the bottom surface of the second region 104b in the first direction D1. According to an embodiment of the present invention, for example, after the thermal treatment 200 is performed, the first region 104a of AlGaN layer 104 is represented by $Al_xGa_{1-x}N$, where x=0.05~0.15, and the second region 104b is represented by $Al_yGa_{1-y}N$, where y=0.16~1.0.

According to another embodiment of the present invention, for example, after the thermal treatment 200 is performed, the first region 104a of the AlGaN layer 104 is represented by $Al_xGa_{1-x}N$, where x=0.05~0.1, and the second region 104b is represented by $Al_yGa_{1-y}N$, where y=0.2~0.5.

According to yet another embodiment of the present invention, for example, after the thermal treatment 200 is performed, the first region 104a of the AlGaN layer 104 is represented by $Al_xGa_{1-x}N$, where x=0.1~0.2, and the second region 104b is represented by $Al_yGa_{1-y}N$, where y=0.25~1.0.

Figure 8:
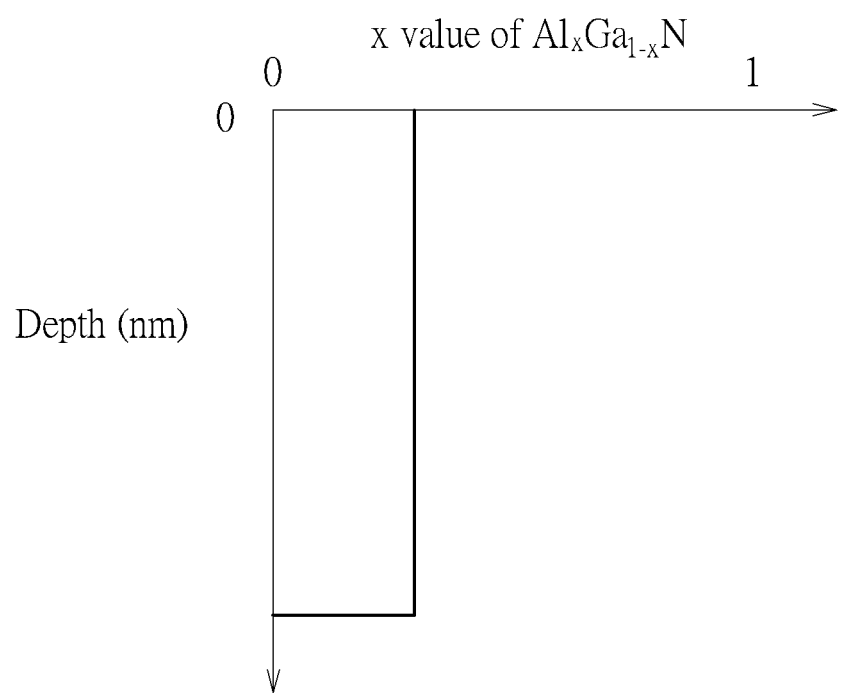
FIG. 8 illustrates a plot showing the x value in the molecular formula represented by $Al_xGa_{1-x}N$ in the first region and the second region of the aluminum gallium nitride layer before the thermal treatment of the aluminum gallium nitride layer, versus the depth of the aluminum gallium nitride layer.

In contrast, as shown in FIG. 7, after the AlGaN layer 104 is treated by thermal treatment 200, the first region 104a of the AlGaN layer 104 represented by $Al_xGa_{1-x}N$ basically has a constant x value without significant changes. Please also refer to FIG. 8, which illustrates a plot showing the x value in the molecular formula represented by $Al_xGa_{1-x}N$ in the first region 104a and the second region 104b of the AlGaN layer 104 before the thermal treatment of the AlGaN layer 104, versus the depth of the aluminum gallium nitride layer. As shown in FIG. 8, before the thermal treatment 200 is performed, the first region 104a and the second region 104b have the same composition, that is, the molecular formula represented by $Al_xGa_{1-x}N$. It can be discerned from FIGS. 7 and 8 that before the thermal treatment 200 is performed, the composition of the AlGaN layer 104 in the first region 104a is basically the same.

Figure 4:
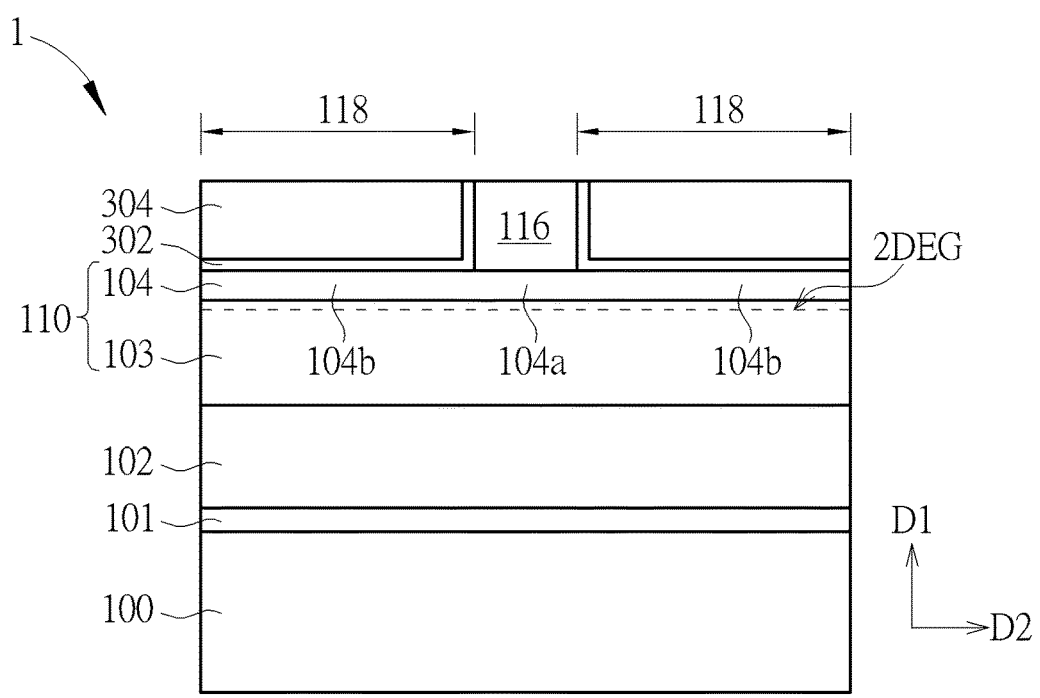

As shown in FIG. 4, according to an embodiment of the present invention, after thermal treatment 200 is performed on the AlGaN layer 104, a passivation layer 302 is formed on the second region 104b. The passivation layer 302 may be provided on the AlGaN layer 104, and may extend to the P—GaN gate 116. For example, the passivation layer 302 may include silicon nitride or aluminum oxide, but is not limited thereto. For example, the thickness of the passivation layer 302 is about 2000 angstroms, but it is not limited thereto. Then, a dielectric layer 304, such as a silicon oxide layer, can be formed on the passivation layer 302. Subsequently, a planarization process may be performed to remove part of the dielectric layer 304 and the passivation layer 302 to expose the upper surface of the P—GaN gate 116.

Figure 5:
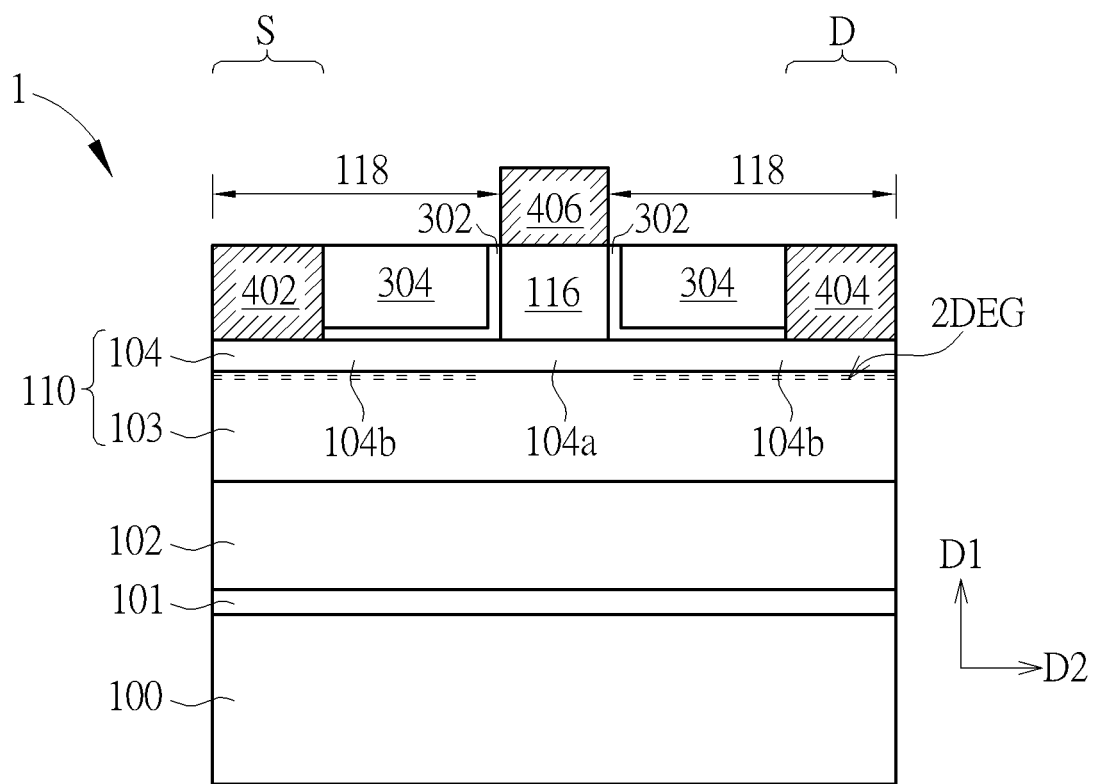
Figure 6A:
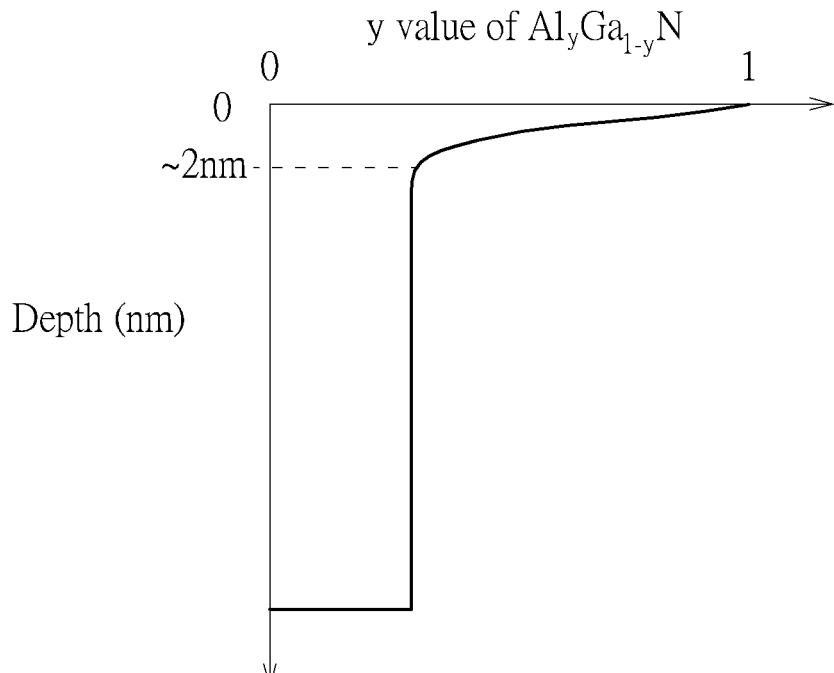
FIG. 6A to FIG. 6D illustrate plots showing the y value in the molecular formula represented by $Al_yGa_{1-y}N$ in the second region of the aluminum gallium nitride layer after the thermal treatment is completed, versus the depth of the aluminum gallium nitride layer in the second region.
Figure 6B:
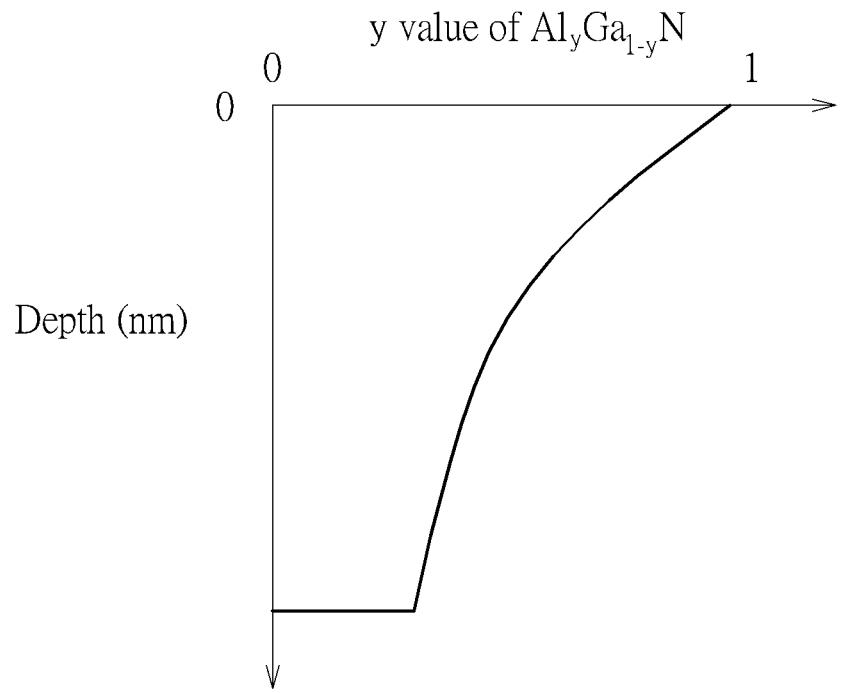
Figure 6C:
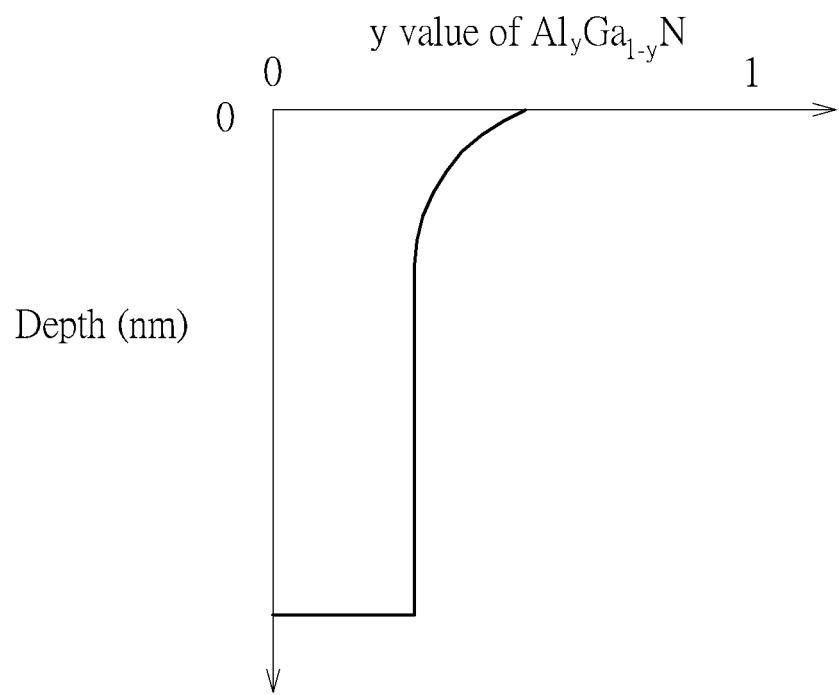
Figure 6D:
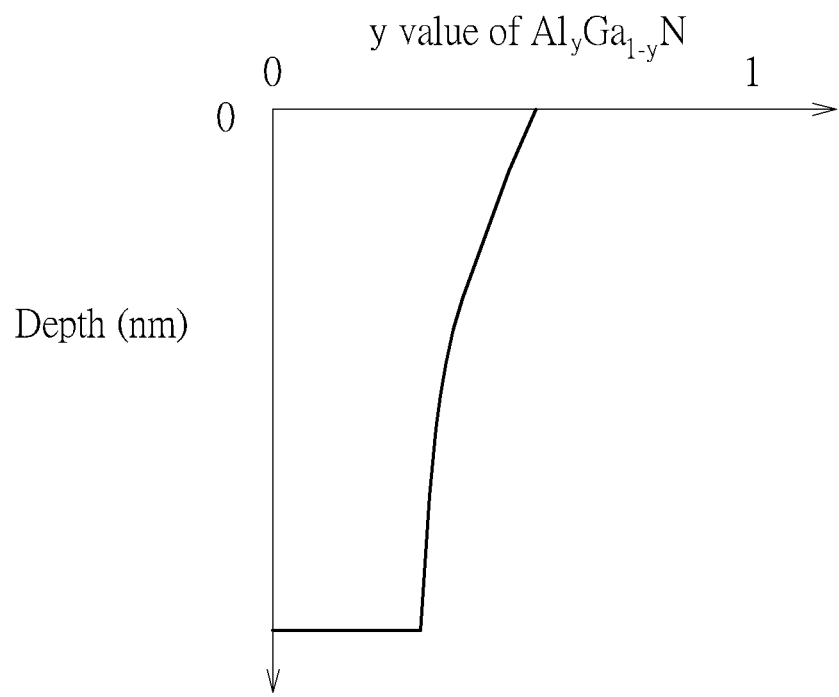

According to an embodiment of the present invention, as shown in FIG. 5, the high electron mobility transistor 1 further includes a source region S and a drain region D on the AlGaN layer 104. A source electrode 402 and a drain electrode 404 are formed on the AlGaN layer 104 in the source region S and the drain region D, respectively. Subsequently, a gate electrode 406 may be formed on the P—GaN gate 116.

One advantage of the present invention is that after forming the P—GaN gate 116 and before forming the passivation layer 302, by performing a thermal treatment 200, a first region 104a and a second region 104b are formed in the AlGaN layer 104. The first region 104a has a different composition from the second region 104b, so that the high electron mobility transistor 1 can have excellent performances of maintained Vth and reduced Ron.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
   a substrate;
   a channel layer on the substrate;
   an AlGaN layer on the channel layer; and
   a P—GaN gate on the AlGaN layer, wherein the AlGaN layer comprises a first region comprising an entire thickness of the AlGaN layer located directly under the P—GaN gate, and a second region that does not overlap with the first region in a thickness direction of the AlGaN layer, and wherein the first region has a composition that is different from that of the second region.

2. The HEMT according to claim 1, wherein the first region has a formula represented by $AlGa_{1-x}N$, wherein x=0.05-0.25, and the second region has a formula represented by $Al_yGa_{1-y}N$, wherein y=0.15-1.0, and wherein y>x.

3. The HEMT according to claim 1, wherein the channel layer comprises GaN or AlGaN.

4. The HEMT according to claim 1 further comprising:
   a buffer layer disposed between the channel layer and the substrate.

5. The HEMT according to claim 1 further comprising:
   a source region and a drain region on the AlGaN layer; and
   a source electrode and a drain electrode on the AlGaN layer within the source region and the drain region, respectively.

6. The HEMT according to claim 1 further comprising:
a passivation layer on the AlGaN layer, wherein the passivation covers the second region.

7. The HEMT according to claim 1, wherein the AlGaN layer has a thickness of 8-30 nm.

8. The HEMT according to claim 1, wherein the P—GaN gate has a thickness of 50-100 nm.

* * * * *